(12) United States Patent
Yang et al.

(10) Patent No.: US 12,054,387 B1
(45) Date of Patent: Aug. 6, 2024

(54) ELECTROSTATICALLY DRIVEN COMB STRUCTURE OF MEMS, MICRO-MIRROR USING SAME AND PREPARATION METHOD THEREFOR

(71) Applicant: XI'AN CHISHINE OPTOELECTRONICS TECHNOLOGY CO., LTD, Xi'an (CN)

(72) Inventors: Tao Yang, Xi'an (CN); HuanHuan Li, Xi'an (CN); Lei Peng, Xi'an (CN); JunWei Jiang, Xi'an (CN); NiNi Zhang, Xi'an (CN); QingFeng Liu, Xi'an (CN); Li Ma, Xi'an (CN); Fang Wang, Xi'an (CN)

(*) Notice: Subject to any disclaimer, the term of this patent is extended or adjusted under 35 U.S.C. 154(b) by 0 days.

(21) Appl. No.: 18/044,571

(22) PCT Filed: Jul. 15, 2022

(86) PCT No.: PCT/CN2022/106028
§ 371 (c)(1),
(2) Date: Mar. 8, 2023

(87) PCT Pub. No.: WO2023/216413
PCT Pub. Date: Nov. 16, 2023

(30) Foreign Application Priority Data

May 11, 2022 (CN) .......................... 202210508327.4

(51) Int. Cl.
*B81C 1/00* (2006.01)
*B81B 3/00* (2006.01)
(Continued)

(52) U.S. Cl.
CPC ........ *B81C 1/00698* (2013.01); *B81B 3/0086* (2013.01); *G02B 26/0841* (2013.01);
(Continued)

(58) Field of Classification Search
CPC ........................... G02B 26/0841; H02N 1/008
See application file for complete search history.

(56) References Cited

U.S. PATENT DOCUMENTS

| | | | |
|---|---|---|---|
| 2005/0231793 A1* | 10/2005 | Sato ................... | G02B 26/0841 359/291 |
| 2015/0131135 A1* | 5/2015 | Reinmuth .......... | G02B 26/0841 438/26 |

FOREIGN PATENT DOCUMENTS

| | | | | |
|---|---|---|---|---|
| CN | 103015691 A | 6/2021 | | |
| WO | WO-2020101015 A1 * | 5/2020 | ......... | B81C 1/00182 |

* cited by examiner

*Primary Examiner* — Moazzam Hossain
(74) *Attorney, Agent, or Firm* — Novoclaims Patent Services LLC; Mei Lin Wong (57) ABSTRACT

Disclosed are an electrostatically driven comb structure of an MEMS (Micro Electro Mechanical System), a micro-mirror using the same, and a preparation method therefor. The surface of a comb of the electrostatically driven comb structure of the MEMS has an insulating layer, and the insulating layers on the surfaces of adjacent combs are the same type of insulating layers or different insulating layers; the micro-mirror with the electrostatically driven comb structure of the MEMS successively includes a substrate, an isolating layer and a device layer from bottom to top; the method for manufacturing the micro-mirror prepares the insulating layers by high temperature oxidization, plasma enhanced chemical vapor deposition, low pressure chemical vapor deposition, atmospheric pressure chemical vapor deposition, physical deposition, atomic layer deposition or stepwise heterogeneous deposition; same or different insulating layers are obtained on the surfaces of the driving comb and the ground comb; when the driving comb and the ground comb adsorb each other, the insulating layers on the surfaces of the two contact without forming a short circuit, so that a good insulating effect is achieved. The electrostatically (Continued)

driven MEMS micro-mirror capable of preventing adsorptive damage provided by the present invention features compact structure and simple process.

6 Claims, 6 Drawing Sheets

(51) Int. Cl.
    *G02B 26/08*     (2006.01)
    *H02N 1/00*     (2006.01)

(52) U.S. Cl.
    CPC ........ *H02N 1/008* (2013.01); *B81B 2201/042* (2013.01); *B81B 2203/0136* (2013.01); *B81B 2203/04* (2013.01); *B81C 2201/0109* (2013.01)

ELECTROSTATICALLY DRIVEN COMB STRUCTURE OF MEMS, MICRO-MIRROR USING SAME AND PREPARATION METHOD THEREFOR

BACKGROUND OF THE PRESENT INVENTION

The present invention relates to the technical field of MEMS (Micro Electro Mechanical Systems), and particularly relates to an electrostatically driven comb structure of an MEMS, a micro-mirror using the same, and a preparation method therefor.

DESCRIPTION OF RELATED ARTS

The electrostatically driven comb structure is a kind of micro-drive structure applied to sensors, drivers and executers of MEMS. The electrostatically driven comb structure usually includes at least one group of driving combs and a group of ground combs. The driving combs and the ground combs are arranged in a staggered manner in an interdigital shape, i.e., two adjacent sides of each driving comb are ground combs, both sides of each ground comb are driving combs, and adjacent combs are spaced and do not contact each other. The driving comb group is connected to a driving voltage, and the ground comb group is connected to a ground lead. Relative displacement, i.e., horizontal displacement or angular displacement, occurs on the driving combs and the ground combs under an electrostatic interaction. In a normal state, the driving combs and the ground combs are spaced and do not contact each other. However, under circumstances of impact vibration and the like, the driving combs and the ground combs may adsorb and contact each other. If the surfaces of the combs have no insulating layers, the driving voltage is directly short-circuited with the ground lead to discharge after the two types of combs contact. The comb contact area generates instantaneous high temperature and even sparks, so that the comb structure is damaged. The MEMS micro-mirror is a kind of MEMS device widely applied to the fields of 3D scanning, projection, ranging, VR and the like. The electrostatically driven MEMS micro-mirror often uses the comb structure and features compact structure, simple process and the like. Therefore, the electrostatically driven MEMS micro-mirror is widely used. The driving structure of the electrostatically driven micro-mirror includes the comb groups staggered. A positive voltage is applied to the opposite group of combs, respectively, and the combs are ground. Therefore, the electrostatic interaction is generated between the opposite combs, which drives the combs to move so as to drive the micro-mirror connected to the combs to move. In the process, the group of opposite combs applied with the positive voltage and ground are staggered to vibrate in an arc shape at a certain angle. The group of combs is spaced. However, under a certain circumstance, for example, transverse deformation of the combs due to unsatisfactory manufacturing process, impact in the using process and the like, the gap between the opposite combs may decreases greatly, and even the combs further adsorb and contact each other under the electrostatic interaction to short-circuit a cathode and a ground terminal to generate a high instantaneous current so as to generate instantaneous high temperature and even sparks or micro-explosion, so that the comb structure is damaged. The adsorptive damage is one of important defects of the electrostatically driven micro-mirror.

Figure 1:
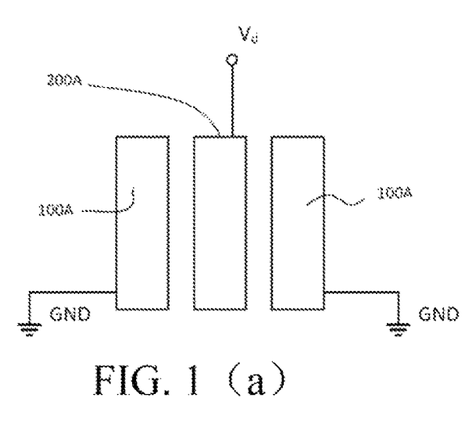
FIG. 1(a) is an electrostatically driven comb structure without insulating layers on surface in a normal state.
FIG. 1(b) is an electrostatically driven comb structure without insulating layers on surface where adjacent combs adsorb and contact.

The normal state of the electrostatically driven comb structure without the insulating layers is shown in FIG. 1(a), and there is a gap between the driving comb 200 connected to the driving voltage Vd and the ground comb 100. The two combs both are conductive. However, as the combs are spaced, the driving comb 200 and the ground comb 100 form a capacitor and the two combs are not short-circuited. FIG. 1(b) shows that the driving comb 200 connected to the driving voltage Vd inclines to contact with the ground comb 100. As the surfaces of the two combs have no insulating layers, the driving comb 200 and the ground comb 100 both are conductive with small resistance. Therefore, in the state, the driving voltage is short-circuited with the ground lead to generate a high instantaneous current. The area where the driving comb 200 and the ground comb 100 contact generates high temperature and even sparks and local explosion, so that the combs are damaged.

SUMMARY OF THE PRESENT INVENTION

In order to overcome defects in the prior art, the objective of the present invention is to provide an electrostatically driven comb structure of an MEMS, a micro-mirror using the same, and a preparation method therefor. Insulating layers are obtained on the surfaces of driving combs and a ground combs by means of plasma enhanced chemical vapor deposition, low pressure chemical vapor deposition, atmospheric pressure chemical vapor deposition (APCVD), physical deposition, atomic layer deposition or stepwise heterogeneous deposition, so that the problem that the electrostatically driven comb structure of the MEMS is easily damaged due to adsorptive discharge is solved.

In order to achieve the above objective, the present invention adopts a technical solution as follows:

The surface of a comb of the electrostatically driven comb structure of the MEMS has an insulating layer, and the insulating layers on the surfaces of adjacent combs are the same type of insulating layers or different insulating layers.

The electrostatically driven comb structure of the MEMS includes at least one group of driving combs and at least one group of ground combs, the driving comb being connected to a driving voltage and the ground comb being connected to a ground lead; the quantities of the combs of each group of driving combs and each group of ground combs are greater than or equal to 1; the driving comb groups and the ground comb groups are arranged in a staggered manner in an interdigital shape, i.e., both sides of each group of driving combs have the ground combs or have no structure, and both sides of each group of ground combs have the driving combs or have no structure.

The electrostatically driven comb structure of the MEMS is used. The micro-mirror successively includes a substrate, an isolating layer and a device layer from bottom to top; the substrate is a frame internally provided with a cavity; the device layer internally comprises a mirror body; the mirror body is connected to an outer frame through a rotary shaft; one end of a ground comb in the electrostatically driven comb structure of the MEMS is connected to the outer frame, one end of a driving comb is connected to the mirror body or the rotary shaft, and the other end of the ground comb and the other end of the driving comb are arranged in a staggered manner; the surfaces of the driving comb and the ground comb both have the insulating layers; the lower surface of the isolating layer contacts the upper surface of the substrate; and the device layer on the upper surface of the isolating layer contacts the lower surface of the outer frame.

The insulating layers on the surfaces of the driving combs and the ground combs are same type of insulating layers or different types of insulating layers; the same type of insulating layers means that the surfaces of the driving combs and the ground combs are the insulating layers A or B; and the different types of insulating layers mean that the surfaces of the driving combs are the insulating layers A or B, and the surfaces of the ground combs are the insulating layers B or A.

A method for preparing a micro-mirror of the electrostatically driven comb structure of the MEMS includes the following steps:

(I) wafer casting: selecting an SOI wafer, and cleaning and drying the wafer for later use, wherein the SOI wafer is a silicon wafer with a three-layered structure, and the SOI wafer comprises a bottom silicon layer, a buried oxide layer and a top silicon layer from bottom to top;

(II) lithographing of the top silicon layer: spin-coating a photoresist to the upper surface of the top silicon layer prepared in S (I) and lithographing the top silicon layer to form a patterned top silicon layer mask;

(III) etching of the top silicon layer: etching the top silicon layer by way of wet etching or dry etching and stopping etching till the buried oxide layer to form the mirror body, the driving comb, the ground comb, the rotary shaft and the outer frame formed by etching and located in the top silicon layer; removing the mask after finishing etching; and etching and removing the top silicon layer with the mirror body, the driving comb, the ground comb, the rotary shaft and the outer frame of the mask to obtain the device layer of the micro-mirror;

(IV) forming of the insulating layers: forming the insulating layers on the surfaces of the mirror body, the driving comb, the ground comb, the rotary shaft and the outer frame formed by etching and located in the top silicon layer, wherein the method for forming the insulating layers comprises: high temperature oxidization, plasma enhanced chemical vapor deposition (PEVCD), low pressure chemical vapor deposition (LPCVD), atmospheric pressure chemical vapor deposition (APCVD), physical deposition (PVD), atomic layer deposition (ALD) or stepwise heterogeneous deposition; the same type of insulating layers is obtained by high temperature oxidization, PEVCD, LPCVD, APCVD, PVD or ALD; and two different types of insulating layers, namely, the insulating layer A and the insulating layer B, are obtained by stepwise heterogeneous deposition;

(V) windowing of the insulating layer: removing a part of insulating layer on the upper surface of the top silicon layer;

(VI) metal deposition: depositing a metal layer in a region of the upper surface of the top silicon layer without the insulating layer;

(VII) protecting of the upper surface: depositing continuous protecting layers on the upper surface of the top silicon layer and the surface of the side wall of the top silicon layer formed by etching, wherein the upper surface of the top silicon layer and the side wall and the bottom of the groove of the top silicon layer formed by etching are covered integrally with the protecting layers;

(VIII) lithographing of the bottom silicon layer: lithographing the lower surface of the bottom silicon layer to form a patterned photoresist mask;

(VIIII) etching of the bottom silicon layer: etching the lower surface of the bottom silicon layer by way of wet etching or dry etching and stopping etching till the buried oxide layer to form a cavity in the bottom silicon layer; removing the mask after etching; and etching and removing the bottom silicon layer with the cavity of the mask to obtain the substrate of the micro-mirror;

(X) releasing: removing the buried oxide layer in the bottom region of the cavity of the bottom silicon layer, where the bottom of the cavity of the bottom silicon layer refers to the side of the cavity of the bottom silicon layer contacting the buried oxide layer; and partially removing the left buried oxide layer to obtain the isolating layer of the micro-mirror;

(XI) removing of front protective films: removing the protecting film on the upper surface of the top silicon layer and the protecting film on the side wall and the bottom of the top silicon layer formed by etching; and (XII) wafer sawing: cutting the processed SOI wafer to obtain several independent MEMS micro-mirrors.

The stepwise heterogeneous deposition in S (IV) includes:
(4.1) depositing a material A with thickness of 0.5-50 nm;
(4.2) depositing a material B with thickness of 0.5-50 nm;
(4.3) radiating the wafer with low energy plasma: radiating the whole wafer towards the surface of a plasma source by using plasma with energy 1-1000 eV, wherein the material A and the material B obtained by depositing are subjected to a first-time reaction to generate an insulating layer A when the upper surface of the top silicon layer of the SOI wafer is radiated;
(4.4) performing plasmic catalysis by structured light; and
(4.5) repeating S (4.1)-S(4.4) the deposited thickness meets the requirement.

The sequence and number of times to deposit the materials A and B are adjusted according to specific demands: the material A is deposited first and then the material B is deposited or the material B is deposited first and then the material A is deposited; and the two materials are deposited alternately at one time, or are deposited alternately many times, i.e., the material A or B is deposited at one time or more, and then the material B or A is deposited at one time or more;

the material A includes modified polydimethylsiloxane with a photo-excited reactive group, modified polymethyl methacrylate with a photo-excited reactive group or modified polyimide with a photo-excited reactive group and derivatives thereof; and the material B is a nanoparticle dispersion liquid with the feature size of 1-15 nm, where nanoparticles in the nanoparticle dispersion liquid include silicon nitride, boron nitride, silicon oxide or aluminum oxide; and a dispersant in the nanoparticle dispersion liquid comprises molecules with the photo-excited reactive group.

The photo-excited reactive group is an active macromolecular group, and can be subjected to a cross-linking reaction under radiation of light with the wavelength $\lambda=10$ nm-1200 nm to adjust the element proportion and group configuration in the photo-excited reactive group, wherein $\lambda$ changes.

The plasmic catalysis by the structured light refers to introduce a catalytic plasma C to the surface of the wafer with the insulating layer A, the catalytic plasma C including an oxygen plasma and a halogen plasma; and meanwhile, the surface of the wafer is irradiated by the structured light with the wavelength $\lambda=10$ nm-1200 nm; the catalytic plasma fully contacts the insulating layer A, and radiated by the light with the wavelength $\lambda$, the insulating layer A is subjected to a secondary reaction to generate an insulating layer B; and other regions are not radiated, and the insulating layer A is retained.

The present invention has the following beneficial effects:
(I) The surfaces of the driving comb and the ground comb have the insulating layers, and the driving comb and the ground comb adsorbing and contacting each other are still kept in an open circuit state without generating phenomena such as short-time high current, short-time high temperature and sparks, that is to say, the MEMS micro-mirror is not damaged.
(II) In the process of preparing the electrostatically driven comb structure of the MEMS capable of preventing adsorptive damage, the insulating layers are manufactured by stepwise heterogenous deposition in S (IV), i.e., the insulating layer A is obtained on the surface of the driving comb and the insulating layer B is obtained on the surface of the ground comb; or the insulating layer B is obtained on the surface of the driving comb and the insulating layer A is obtained on the surface of the ground comb. When the driving comb and the ground comb adsorb, the insulating layers A and B on the surfaces of the two contact, so that a good insulating effect is achieved. The driving comb and the ground comb are still kept in an open circuit state without generating phenomena such as short-time high current, short-time high temperature and sparks, that is to say, the micro-mirror is not damaged. When the insulating layers A and B contact, the friction coefficient therebetween is smaller than that between the insulating layers A or the insulating layers B, which has smaller disturbance to the MEMS micro-mirror in work, so that the stability of the micro-mirror can be better kept.
(III) Different insulating layers are obtained on the surfaces of the driving comb and the ground comb by stepwise heterogeneous deposition, and the two different insulating layers contact during adsorption, and the friction coefficient is smaller, which has smaller disturbance to the MEMS micro-mirror in work, so that the stability of the micro-mirror is higher.
(IV) The electrostatically driven comb structure of the MEMS capable of preventing adsorptive damage provided by the present invention features compact structure and simple process.

BRIEF DESCRIPTION OF THE DRAWINGS

FIG. 4(a-k) show a schematic diagram of a preparation process flow of the electrostatically driven micro-mirror with the insulating layers on the surfaces of the combs obtained by high-temperature oxidization.

FIG. 5(a-k) show a schematic diagram of a preparation process flow of the electrostatically driven micro-mirror with the insulating layers on the surfaces of the combs obtained by stepwise heterogeneous deposition.

FIG. 6(a-f) show a schematic diagram of a preparation process flow by stepwise heterogeneous deposition.

In the drawings, driving voltage Vd, ground comb 100, driving comb 200, mirror body 300, rotary shaft 400, anchor body 500, outer frame 600, substrate 800, groove structure 810, insulating layer 01, bottom silicon layer 10, buried oxide layer 20, substrate 10', cavity 11, isolating layer 20', top silicon layer 30, device layer 30', groove 31, top silicon layer mask 40A, bottom silicon layer mask 40B, oxidized insulating layer 50, material A 50', material B 50", insulating layer A 51, insulating layer B 52, metal layer 60, protective layer 70.

DETAILED DESCRIPTION OF THE PREFERRED EMBODIMENT

The present invention will be described in detail below in combination with drawings.

Figure 2:
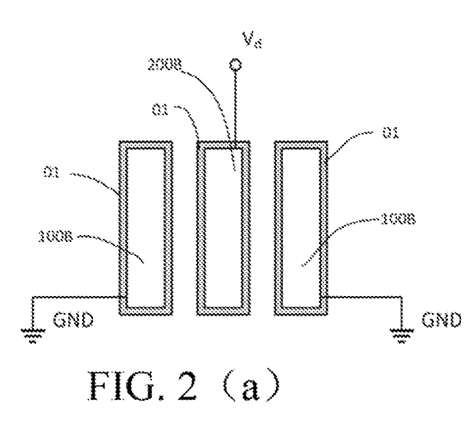
FIG. 2(a) is an electrostatically driven comb structure with insulating layers on surface in a normal state.
FIG. 2(b) is an electrostatically driven comb structure with insulating layers on surface where adjacent combs adsorb and contact.

The surface of a comb of the electrostatically driven comb structure of the MEMS has an insulating layer 01, and the insulating layers on the surfaces of adjacent combs are the same type of insulating layers or different insulating layers. The combs are spaced in the normal state, as shown in FIG. 2(a).

The electrostatically driven comb structure of the MEMS includes at least one group of driving combs 200 and at least one group of ground combs 100, the driving comb being connected to a driving voltage and the ground comb being connected to a ground lead; the quantities of the combs of each group of driving combs and each group of ground combs are greater than or equal to 1; the driving comb groups and the ground comb groups are arranged in a staggered manner in an interdigital shape, i.e., both sides of each group of driving combs have the ground combs or have no structure, and both sides of each group of ground combs have the driving combs or have no structure. In the normal state, the adjacent combs are spaced and do not contact each other. When the driving combs 200 and the ground combs 100 contact accidentally, as shown in FIG. 2(b), in the presence of the insulating layers 01 on the surfaces of the combs, the driving combs and the ground combs are kept in an insulating layer without short circuit, so that phenomena such as high current, high temperature and even sparks are avoided. Therefore, the comb structure will not be damaged due to short-circuited discharge. The reason why the driving combs and the ground combs contact includes errors of a manufacturing process, comb adsorption in the manufacturing process and impact to the combs.

FIG. 3(a) is the planar graph of the micro-mirror with insulating layers 01 on the surfaces of the combs. The micro-mirror of the electrostatically driven comb structure of the MEMS has a mirror body 300. Two opposite sides of the mirror body 300 are connected to an anchor body 500 through a rotary shaft 400. The driving combs 200 are arranged on two axial sides of the rotary shaft 400. An outer frame 600 is arranged in the peripheries of the mirror body 300, the rotary shaft 400, the anchor body 500 and the driving combs 200. The ground combs 100 are arranged on the inner side of the outer frame 600. The ground combs 100 and the driving combs 200 are successively arranged in a staggered manner in the horizontal direction in an interdigital shape. The surfaces of the driving combs 200 and the ground combs 100 all have the insulating layers 01.

FIG. 3(b) is the sectional drawing of the micro-mirror with insulating layers 01 on the surfaces of the comb shown in FIG. 3(a). The micro-mirror successively includes a substrate 10', an isolating layer 20' and a device layer 30; from bottom to top. The mirror body 300, the rotary shaft 400, the anchor body 500, the driving combs 200, the ground comb 100 and the outer frame 600 of the micro-mirror all are located in the device layer 30'. The substrate 10' is a frame internally provided with a cavity 11, the lower surface of the isolating layer 20' contacts the upper surface of the substrate 10', and the upper surface of the isolating layer 20' contacts the lower surfaces of the outer frame 600 and the anchor body 500. The mirror body 300 can rotate around the rotary shaft 400.

The insulating layers on the surfaces of the driving combs and the ground combs can be the same type of insulating layers or different types of insulating layers. The same type of insulating layers means that the surfaces of the driving combs and the ground combs are the insulating layers A or B; and the different types of insulating layers mean that the surfaces of the driving combs are the insulating layers A (B), and the surfaces of the ground combs are the insulating layers B (A). The same type of insulating layers or the different types of insulating layers can achieve electrical isolation, i.e., the open circuit state. However, when the different types of insulating layers contact each other, the friction coefficient is smaller. Compared with contact of the same type of insulating layers, the frictional resistance under a condition that the driving combs contact the ground combs is further reduced, so that the stability of the MEMS micro-mirror is improved.

Figure 4:
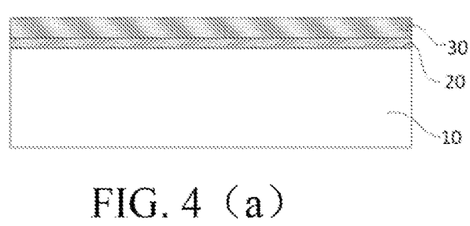

Referring to FIG. 4(a-k), a method for preparing a micro-mirror of the electrostatically driven comb structure of the MEMS by high-temperature oxidization includes the following steps:

(I) wafer casting: an SOI wafer is selected, and the wafer are cleaned and dried for later use, where the SOI wafer is a silicon wafer with a three-layered structure, and the SOI wafer includes a bottom silicon layer 10, a buried oxide layer 20 and a top silicon layer 30 from bottom to top.

(II) lithographing of the top silicon layer (30): a photoresist is spin-coated to the upper surface of the top silicon layer 30 prepared in S (I) and lithographing the top silicon layer to form a patterned top silicon layer mask 40A.

(III) etching of the top silicon layer: the top silicon layer 30 is etched by way of an inductively coupled plasma etching method: the part of the top silicon layer not shielded by the top silicon layer mask 40A is etched and removed till the buried oxide layer 20 on the lower surface of the top silicon layer 30, and the part shielded by the top silicon layer mask 40A is reserved to form the groove 31 in the top silicon layer; and the top silicon layer mask 40A is removed after etching is finished.

(IV) Forming of the insulating layer: the SOI wafer with the top silicon layer 30 etched in S (III) is placed in a high-temperature furnace for oxidization, where oxidized insulating layers 50 consisting of silicon dioxide are formed on the upper surface of the top silicon layer 30, the side wall of the groove 31 of the top silicon layer 30 and the lower surface of the bottom silicon layer 10.

(V) windowing of the insulating layer: the insulating layer 50 in the partial region of the upper surface of the top silicon layer 30 is removed.

(VI) metal deposition: a metal layer 60 is deposited in a region of the upper surface of the top silicon layer 30 without the insulating layer 50.

(VII) Protecting of upper surface: the protective layers 70 are coated to the upper surface of the top silicon layer 30 and the side wall and the bottom of the groove 31.

(VIII) lithographing of the bottom silicon layer: the photoresist is spin-coated to the lower surface of the bottom silicon layer 10 and the lower surface is photoetched to form a patterned bottom silicon layer mask 40B formed by the photoresist.

(VIIII) etching of the bottom silicon layer: the oxidized insulating layer 50 on the surface of the bottom silicon layer 10 is etched by way of a reactive ion etching method, the bottom silicon layer 10 is etched by way of the inductively coupled plasma etching method: the parts of the top silicon layer 10 and the oxidized insulating layer 50 on the surface of the top silicon layer shielded by the bottom silicon layer mask 40B are reserved, and the parts not shielded by the bottom silicon layer mask 40B are etched and removed till the buried oxide layer 20, and the cavity 11 is formed in the bottom silicon layer 10. The bottom silicon layer 10 with the cavity 11 formed herein is the substrate 10' forming the micro-mirror in FIG. 3(b).

(X) releasing: the buried oxide layer (20) in the corresponding region of the bottom of the cavity 11 of the bottom silicon layer 10 is removed, where the bottom of the cavity 11 of the bottom silicon layer 10 refers to the side of the cavity 11 of the bottom silicon layer 10 contacting the buried oxide layer 20.

(XI) Protecting of a front protective film: the protective layers 70 on the upper surface of the top silicon layer 30 and the side wall and the bottom of the groove 31 are removed.

(XII) wafer sawing: the processed SOI wafer is cut to obtain several independent MEMS micro-mirrors.

Figure 5:
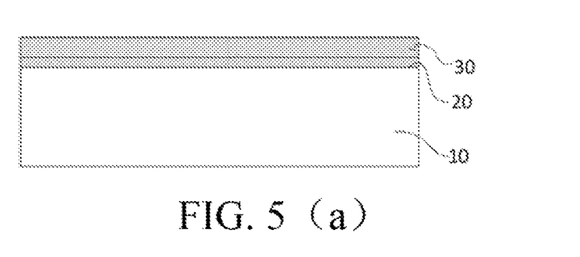

Referring to FIG. 5(a-k), a method for preparing a micro-mirror of the electrostatically driven comb structure of the MEMS by stepwise heterogeneous deposition includes the following steps:

(I) preparation of an SOI wafer The SOI wafer includes the bottom silicon layer 10, the buried oxide layer 20 and the top silicon layer 30 from bottom to top.

(II) etching of the top silicon layer A photoresist is spin-coated to the upper surface of the top silicon layer 30 prepared in S (I) and the upper surface of the top silicon layer is photoetched to form a patterned top silicon layer mask 40A formed by the photoresist.

(III) etching of the top silicon layer The top silicon layer 30 is etched by way of an inductively coupled plasma etching method: the part of the top silicon layer 30 not shielded by the top silicon layer mask 40A is etched and removed till the buried oxide layer 20 on the lower surface of the top silicon layer 30, and the part shielded by the bottom silicon layer mask 40B is reserved to form the groove 31 in the top silicon layer 30; and the top silicon layer mask 40A is removed after etching is finished.

(IV) stepwise heterogeneous deposition The insulating layers are formed on the upper surface of the top silicon layer 30 and the side wall and the bottom of the groove 31 etched in the S (III) by way of stepwise heterogeneous deposition; stepwise heterogeneous deposition is adopted herein to respectively obtain the insulating layer A 51 and the insulating layer B 52 on the surfaces of opposite side walls of the groove 31 of the top silicon layer 30 of the SOI wafer.

(V) windowing of the insulating layer The insulating layer A (51) in the partial region of the upper surface of the top silicon layer 30 is removed.

(VI) metal deposition The metal layer 60 IS deposited in a region of the upper surface of the top silicon layer 30 without the insulating layer A51.

(VII) Protecting of the upper surface The protective layers 70 are coated to the upper surface of the top silicon layer 30 and the side wall and the bottom of the groove 31.

(VIII) lithographing of the bottom silicon layer: the photoresist is spin-coated to the lower surface of the bottom silicon layer 10 and the lower surface is photoetched to form a patterned bottom silicon layer mask 40B formed by the photoresist.

Figure 3:
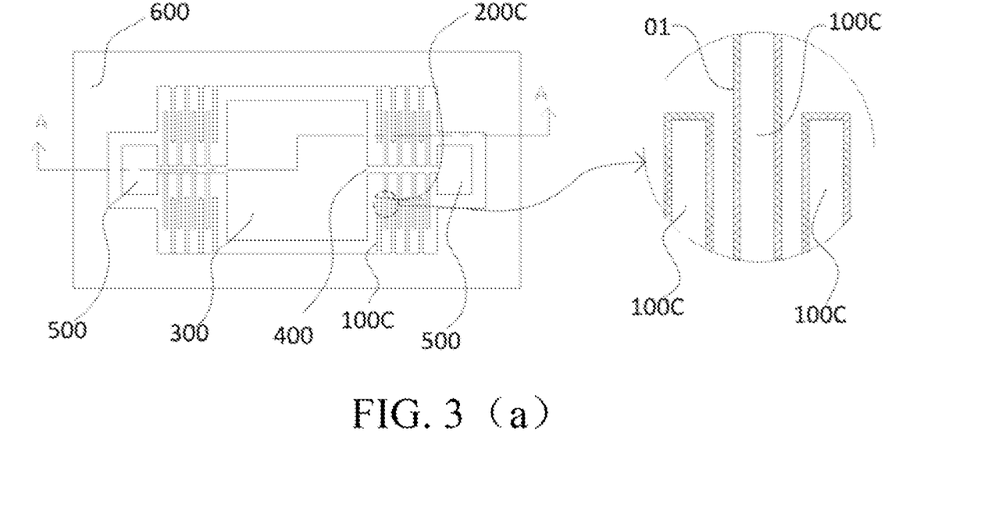
FIG. 3(a) is a planar graph of an electrostatically driven micro-mirror with insulating layers on surfaces of combs.
FIG. 3(b) is a sectional drawing of an electrostatically driven micro-mirror with insulating layers on surfaces of combs.

(VIIII) etching of the bottom silicon layer: the bottom silicon layer 10 is etched by way of the inductively coupled plasma etching method: the part of the top silicon layer 10 shielded by the bottom silicon layer mask 40B is reserved, and the part not shielded by the bottom silicon layer mask 40B is etched and removed till the buried oxide layer 20, and the cavity 11 is formed in the bottom silicon layer 10. The bottom silicon layer 10 with the cavity 11 formed herein is the substrate 10' forming the micro-mirror in FIG. 3(*b*).

(X) releasing: the buried oxide layer (20) in the corresponding region of the bottom of the cavity 11 of the bottom silicon layer 10 is removed, where the bottom of the cavity 11 of the bottom silicon layer 10 refers to the side of the cavity 11 of the bottom silicon layer 10 contacting the buried oxide layer 20.

(XI) Protecting of a front protective film: the protective layers 70 on the upper surface of the top silicon layer 30 and the side wall and the bottom of the groove 31 are removed.

(XII) wafer sawing: the processed SOI wafer is cut to obtain several independent MEMS micro-mirrors.

Figure 6:
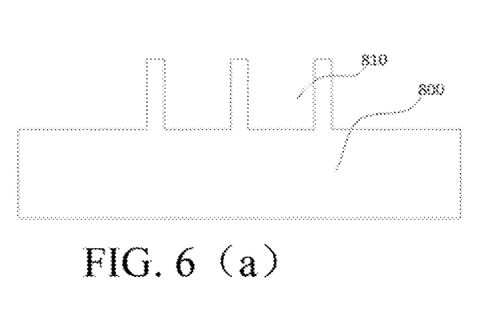

Referring to FIG. 6(*a-f*), the preparation process flow by stepwise heterogeneous deposition includes the following steps:

the substrate 800 with the groove structure 810 is prepared first:

(4.1) Deposition of the material A The material A 50', with the thickness of 10 mn, is deposited on the surface of one side of the substrate 800 with the groove structure 810.

(4.2) Deposition of the material B The material B 50', with the thickness of 10 mn, is deposited on the surface of the substrate 800 where the obtained material A is deposited.

(4.3) Low energy plasma radiating The surfaces of the substrate 800 where the material A 50' and the material B 50" are deposited are irradiated with low energy plasma, so that the material A 50' and the material B 50" successively deposited react to generate the insulating layer A51.

(4.4) Plasmic catalysis by structured light: the catalytic plasma C is introduced to the surface of one side of the substrate 800 where the insulating layer A51 is formed, and the surface is irradiated by the structured light with the wavelength of 280±10 nm. When the structured light irradiates the surface, part of the region is irradiated, and the other part of the region is not irradiated, as shown in drawings. The insulating layer A51 in the irradiated region reacts with the catalytic plasma C to generate the insulating layer B52. The structured light herein plays a role of irradiating the selected region of the insulating layer A51 located on the surface of the wafer to generate the insulating layer B52. The insulating layer A51 in the non-irradiated region does not react with the catalytic plasma, and the insulating layer A51 is kept. The part of region on the surface of the groove structure 810 of the substrate 800 is covered with the insulating layer A51 and the other part of region is covered with the insulating layer B52.

The structured light means that light with the wavelength of λ is modulated into the structured light, i.e., the light wave surface is a discontinuous wave surface but is distributed in the plane where the light passes through according to a certain pattern. The structured light refers to description of planar distribution state of the modulated light with the wavelength of λ rather than other light.

What is claimed is:

1. A method for preparing a micro-mirror, wherein the micro-mirror uses an electrostatically driven comb structure of an MEMS (Micro Electro Mechanical System); the surface of a comb of the electrostatically driven comb structure of the MEMS has an insulating layer (01), and the insulating layers on the surfaces of adjacent combs are the same type of insulating layers or different insulating layers; the micro-mirror successively comprises a substrate (10'), an isolating layer (20') and a device layer (30') from bottom to top; the substrate (10') is a frame internally provided with a cavity; the device layer (20') internally comprises a mirror body (300); the mirror body (300) is connected to an outer frame (600) through a rotary shaft (400); one end of a ground comb (100) in the electrostatically driven comb structure of the MEMS is connected to the outer frame (600), one end of a driving comb (200) is connected to the mirror body (300) or the rotary shaft (400), and the other end of the ground comb (100) and the other end of the driving comb (200) are arranged in a staggered manner; the surfaces of the driving comb (200) and the ground comb (100) both have the insulating layers (01); the lower surface of the isolating layer (20') contacts the upper surface of the substrate (10'); and the device layer (30') on the upper surface of the isolating layer (20') contacts the lower surface of the outer frame (600); and wherein the method comprises the following steps:

(I) wafer casting: selecting an SOI wafer, and cleaning and drying the wafer for later use, wherein the SOI wafer is a silicon wafer with a three-layered structure, and the SOI wafer comprises a bottom silicon layer (10), a buried oxide layer (20) and a top silicon layer (30) from bottom to top;

(II) lithographing of the top silicon layer (30): spin-coating a photoresist to the upper surface of the top silicon layer (30) prepared in step (I) and lithographing the top silicon layer to form a patterned top silicon layer mask (40A);

(III) etching of the top silicon layer (30): etching the top silicon layer (30) by way of wet etching or dry etching and stopping etching till the buried oxide layer (20) to form the mirror body, the driving comb, the ground comb, the rotary shaft and the outer frame formed by etching and located in the top silicon layer; removing the top silicon layer mask (40A) after finishing etching; and etching and removing the top silicon layer with the mirror body, the driving comb, the ground comb, the rotary shaft and the outer frame of the top silicon layer mask (40A) to obtain the device layer (30') of the micro-mirror;

(IV) forming of the insulating layers: forming the insulating layers on the surfaces of the mirror body, the driving comb, the ground comb, the rotary shaft and the outer frame formed by etching and located in the top silicon layer, wherein the method for forming the insulating layers comprises: high temperature oxidization, plasma enhanced chemical vapor deposition (PEVCD), low pressure chemical vapor deposition (LPCVD), atmospheric pressure chemical vapor deposition (APCVD), physical deposition (PVD), atomic layer deposition (ALD) or stepwise heterogeneous deposition; the same type of insulating layers is obtained by high temperature oxidization, PEVCD, LPCVD, APCVD, PVD or ALD; and two different types of insulating layers, namely, the insulating layer A and the insulating layer B, are obtained by stepwise heterogeneous deposition;

(V) windowing of the insulating layer: removing a part of insulating layer on the upper surface of the top silicon layer (30);

(VI) metal deposition: depositing a metal layer (60) in a region of the upper surface of the top silicon layer (30) without the insulating layer;

(VII) protecting of the upper surface: depositing continuous protecting layers (70) on the upper surface of the top silicon layer (30) and the surface of the side wall of the top silicon layer formed by etching, wherein the upper surface of the top silicon layer and the side wall and the bottom of the groove of the top silicon layer formed by etching are covered integrally with the protecting layers (70);

(VIII) lithographing of the bottom silicon layer: lithographing the lower surface of the bottom silicon layer (10) to form a patterned bottom silicon layer mask (40B) formed by the photoresist;

(VIIII) etching of the bottom silicon layer: etching the lower surface of the bottom silicon layer (10) by way of wet etching or dry etching and stopping etching till the buried oxide layer to form a cavity (11) in the bottom silicon layer (10); removing the bottom silicon layer mask (40B) after etching; and etching and removing the bottom silicon layer (10) with the cavity (11) of the bottom silicon layer mask (40B) to obtain the substrate (10') of the micro-mirror;

(X) releasing: removing the buried oxide layer (20) in the bottom region of the cavity (11) of the bottom silicon layer (10), wherein the bottom of the cavity (11) of the bottom silicon layer (10) refers to the side of the cavity (11) of the bottom silicon layer (10) contacting the buried oxide layer (20); and partially removing the left buried oxide layer (20) to obtain the isolating layer (20') of the micro-mirror;

(XI) removing of front protective films: removing the protecting film on the upper surface of the top silicon layer and the protecting film on the side wall and the bottom of the top silicon layer formed by etching; and (XII) wafer sawing: cutting the processed SOI wafer to obtain several independent MEMS micro-mirrors.

2. The method for preparing a micro-mirror according to claim 1, comprising the following steps:
the stepwise heterogeneous deposition in step (IV) further comprises:
(4.1) depositing a material A with thickness of 0.5-50 nm;
(4.2) depositing a material B with thickness of 0.5-50 nm;
(4.3) radiating the wafer with low energy plasma: radiating the whole wafer towards the surface of a plasma source by using plasma with energy 1-1000 eV, wherein the material A and the material B obtained by depositing are subjected to a first-time reaction to generate an insulating layer A when the upper surface of the top silicon layer of the SOI wafer is radiated;
(4.4) performing plasmic catalysis by structured light; and
(4.5) repeating step (4.1) step (4.4) till the deposited thickness meets the requirement.

3. The method for preparing a micro-mirror according to claim 2, wherein the sequence and number of times to deposit the materials A and B are adjusted according to specific demands: the material A is deposited first and then the material B is deposited or the material B is deposited first and then the material A is deposited; and the two materials are deposited alternately at one time, or are deposited alternately many times, i.e., the material A or B is deposited at one time or more, and then the material B or A is deposited at one time or more;
the material A comprises modified polydimethylsiloxane with a photo-excited reactive group, modified polymethyl methacrylate with a photo-excited reactive group or modified polyimide with a photo-excited reactive group and derivatives thereof;
the material B is a nanoparticle dispersion liquid with a feature size of 1-15 nm, wherein nanoparticles in the nanoparticle dispersion liquid comprise silicon nitride, boron nitride, silicon oxide or aluminum oxide; and a dispersant in the nanoparticle dispersion liquid comprises molecules with the photo-excited reactive group; and
the photo-excited reactive group is an active macromolecular group, and can be subjected to a cross-linking reaction under radiation of light with the wavelength $\lambda=10$ nm-1200 nm to adjust the element proportion and group configuration in the photo-excited reactive group, wherein $\lambda$ changes.

4. The method for preparing a micro-mirror according to claim 2, wherein the plasmic catalysis by the structured light refers to introduce a catalytic plasma C to the surface of the wafer with the insulating layer A, the catalytic plasma C comprising an oxygen plasma and a halogen plasma; and meanwhile, the surface of the water is irradiated by the structured light with the wavelength $\lambda=10$ nm-1200 nm; the catalytic plasma fully contacts the insulating layer A, and radiated by the light with the wavelength $\lambda$, the insulating layer A is subjected to a secondary reaction to generate an insulating layer B; and other regions are not radiated, and the insulating layer A is retained.

5. The method for preparing a micro-mirror according to claim 1, wherein the electrostatically driven comb structure of the MEMS comprises at least one group of driving combs (200) and at least one group of ground combs (100), the driving comb (200) being connected to a driving voltage and the ground comb (100) being connected to a ground lead; the quantities of the combs of each group of driving combs (200) and each group of ground combs (100) are greater than or equal to 1; the driving comb groups and the ground comb groups are arranged in a staggered manner in an interdigital shape, i.e., both sides of each group of driving combs (200) have the ground combs (100) or have no structure, and both sides of each group of ground combs (100) have the driving combs (200) or have no structure.

6. The method for preparing a micro-mirror according to claim 5, wherein the insulating layers on the surfaces of the driving combs (200) and the ground combs (100) are same type of insulating layers or different types of insulating layers; the same type of insulating layers means that the surfaces of the driving combs and the ground combs are the insulating layers A or B; and the different types of insulating layers mean that the surfaces of the driving combs are the insulating layers A or B, and the surfaces of the ground combs are the insulating layers B or A.

\* \* \* \* \*